United States Patent
Schmidt

(10) Patent No.: US 10,069,494 B2
(45) Date of Patent: Sep. 4, 2018

(54) PROXIMITY SENSOR

(71) Applicant: SAFRAN LANDING SYSTEMS CANADA INC./SAFRAN SYSTEMES D'ATTERRISSAGE CANADA INC., Ajax, ON (CA)

(72) Inventor: Robert Kyle Schmidt, Cheltenham (GB)

(73) Assignee: Safran Landing Systems Canada Inc./Safran Systemes D'Atterrissage Canada Inc., Ajax, Ontario (CA)

(*) Notice: Subject to any disclaimer, the term of this patent is extended or adjusted under 35 U.S.C. 154(b) by 384 days.

(21) Appl. No.: 13/789,779

(22) Filed: Mar. 8, 2013

(65) Prior Publication Data

US 2014/0252210 A1    Sep. 11, 2014

(51) Int. Cl.
*G01B 11/16* (2006.01)
*H03K 17/945* (2006.01)
(Continued)

(52) U.S. Cl.
CPC .......... *H03K 17/945* (2013.01); *G01K 11/32* (2013.01); *G01V 3/08* (2013.01); *H03K 2217/95* (2013.01)

(58) Field of Classification Search
CPC ......... G01B 11/14; G01B 11/16; G01J 1/0425
(Continued)

(56) References Cited

U.S. PATENT DOCUMENTS 5,334,831 A    8/1994  Maurice
6,955,085 B2 * 10/2005 Jones et al. ................ 73/514.26
(Continued)

FOREIGN PATENT DOCUMENTS

WO    WO2009067994 A1    6/2009

OTHER PUBLICATIONS

S.M. Goedeke et al., "Dual-Fiberoptic Microcantilever Proximity Sensor" Proc. SPIE 4468, Engineering Thin Films with Ion Beams, Nanoscale Diagnostics, and Molecular Manufacturing, 161 (Dec. 27, 2001) (online at http://proceedings.spiedigitallibrary.org/proceeding.aspx?articleid=891573).
(Continued)

*Primary Examiner* — Kevin Pyo
(74) *Attorney, Agent, or Firm* — Christensen O'Connor Johnson Kindness PLLC

(57) ABSTRACT

A proximity sensor for detecting non-contact detection of a target using a fiber optic strain sensor and a system for operating multiple such proximity sensors is disclosed. The proximity sensor includes an optic fiber that has an optic fiber strain sensor that is coupled to a mass that moves in response to the target. The mass can be a magnet that moves when a ferrous target is within the magnetic field of the magnet causing the magnet to move and apply strain to the optic fiber strain sensor. The optic strain sensor can include periodic variation in the refractive index of the optic fiber, such as a fiber Bragg grating. The proximity sensor can include a second fiber optic sensor that is sensitive to temperature or a second fiber optic strain sensor coupled to a second magnet that operates in opposition to the first magnet. A system coupling multiple proximity sensors can include an interrogator that has an optical power source and a detector, each coupled to a processor. The processor compares frequency information from the proximity sensor to a threshold to determine whether a target is in proximity to its corresponding proximity sensor.

18 Claims, 5 Drawing Sheets

(51) Int. Cl.
*G01V 3/08* (2006.01)
*G01K 11/32* (2006.01)

(58) Field of Classification Search
USPC ............ 250/227.14, 227.16, 227.18, 227.23,
250/227.24; 385/13, 25, 27, 39, 75;
73/800
See application file for complete search history.

(56) References Cited

U.S. PATENT DOCUMENTS 8,049,158 B2    11/2011  Kosht et al.
8,379,225 B2 *  2/2013  Koste et al. ................. 356/614

OTHER PUBLICATIONS

International Search Report dated Jun. 12, 2014 issued by the Canadian Intellectual Property Office relating to PCT International Application No. PCT/CA2014/000190.
Written Opinion of the International Searching Authority dated Jun. 12, 2014 issued by the Canadian Intellectual Property Office relating to PCT International Application No. PCT/CA2014/000190.

* cited by examiner

PROXIMITY SENSOR

FIELD OF THE INVENTION

The present invention relates to a proximity sensor for non-contact detection of a target. More particularly, the present invention relates to a proximity sensor system for use in an aircraft.

BACKGROUND OF THE INVENTION

Presently there exist a wide variety of non-contact proximity detectors. The vast majority of these are electrical in nature, using either a change in inductance or capacitance introduced by the presence of a suitable target to allow detection of the target. Other sensors employ optical means using the reflection of light from a target or similar means employing the transmission of a light beam beyond the sensor and subsequent detection of a changed beam.

Most existing fibre optic proximity detectors employ a transmission and detection fibre and rely on light reflection external to the sensor to provide the indication of target presence. While suitable for a wide variety of tasks, these sensors are not appropriate in dirty conditions where the emitting or sensing portion of the sensor may be obscured by dust, dirt, or other contaminants.

In aircraft applications, inductive proximity sensing is commonly used. The sensors typically employ a two or three wire electrical connection to an interrogation system designed to query the sensor and determine its inductance, and from that infer whether a target is 'near' or 'far'. While the systems in practice are reliable and proven, when a system incorporating a large quantity of sensors is envisaged, the sheer number of electrical connections required can become large. In addition, significant effort needs to be expended to ensure proper protection from high intensity radiated fields, lightning strikes, and wire length limitations.

As aircraft construction moves from predominantly metallic construction materials (such as aluminum) to more organic matrix composite construction, significant consideration needs to be given to the overall lack of shielding and lightning protection that was once afforded by having a low resistance, conductive aircraft surrounding all electrical elements. One approach to address this issue is to transition the electrical proximity sensing system to an all optical fibre system.

The present art of fibre optic proximity sensing includes two principal types of sensor—an external reflectance type sensor, where light is transmitted from one fibre and a target mirror reflects that light into a neighbouring detection fibre in the 'near' condition, and a magnetic sensor employing the Faraday effect. The magnetic sensor employs two fibres but utilizes a magnet as the target to change the polarization of light that passes through the sensor from one fibre to the other. This sensor is potentially viable for aircraft applications as there is no external light emitting component. However, the requirement that each sensor have two fibres is onerous in large systems and would require large amounts of fibre and electronics for querying each sensor.

SUMMARY

Accordingly, there is provided proximity sensor for detection of a target in a near position to the sensor, the sensor comprising an optic fibre having an optic fibre strain sensor; and a mass flexibly coupled to the optic fibre, the mass configured to move in response to the near position of the target, wherein movement of the mass alters the strain applied to the optic fibre strain sensor. In some aspects the optic fibre strain sensor has a characteristic frequency response that shifts in response to the applied strain. The optic fibre strain sensor can have a period variation in the refractive index of the optic fibre, such as, for example, Bragg gratings, long period fibre gratings and chiral gratings. In some aspects the proximity sensor can also include an optic fibre temperature sensor that is isolated from movement of the mass and has a characteristic frequency response that shifts in response to temperature. The temperature sensor can be located adjacent to the strain sensor. In some aspects, the optic fibre can include an optical delay, such as a length of optic fibre, in order to distinguish between the frequency response of the strain and temperature sensors.

In some aspects, the mass can be a magnet that moves in response to the target. In some aspects, the proximity sensor can further include a damper coupled to the mass. In still further aspects, the proximity sensor can include a resilient connector to couple the mass to the optic fibre. In another aspect, the proximity sensor can further include a second optic fibre strain sensor flexibly coupled to a second mass, the second mass configured to move in an opposite direction to the mass in response to the near position of the target.

According to a second aspect, there is provided a proximity sensor, for non-contact detection of a target, comprising a housing containing an optic fibre having a fibre Bragg grating; and a mass, formed from magnetic material, coupled to the optical fibre at a portion adjacent the fibre Bragg grating, the mass configured to move relative to the optical fibre in response to the target. The mass can be operable to move between an active position and an inactive position, wherein the active position is located distal to the optical fibre and the inactive position is located proximal the optical fibre.

According to a third aspect, there is provided an aircraft fibre optic proximity sensor system comprising proximity sensors, each proximity sensor comprising a fibre optic strain sensor having a characteristic frequency; and a proximity sensor interrogator coupled to the proximity sensors by an optical fibre. The proximity sensor has an optical power source and a detector coupled to the optical fibre and the detector is configured, for each of the proximity sensors, to obtain frequency information corresponding to the fibre optic strain sensor. The system can further include a processor coupled to the detector that is configured to receive frequency information from the fibre optic strain sensor and compare the frequency information to a predefined threshold in order to determine whether a target is located in proximity to a corresponding one of the proximity sensors. In some aspects, the processor can be configured to receive second frequency information from a fibre optic temperature sensor and correct the frequency information from the fibre optic strain sensor with the second frequency information from the fibre optic temperature sensor to account for temperature.

BRIEF DESCRIPTION OF THE DRAWINGS

For a better understanding of the various embodiments described herein and to show more clearly how they may be carried into effect, reference will now be made, by way of example only, to the accompanying drawings which show at least one exemplary embodiment, and in which.

DETAILED DESCRIPTION OF THE PREFERRED EMBODIMENTS

Figure 1A:
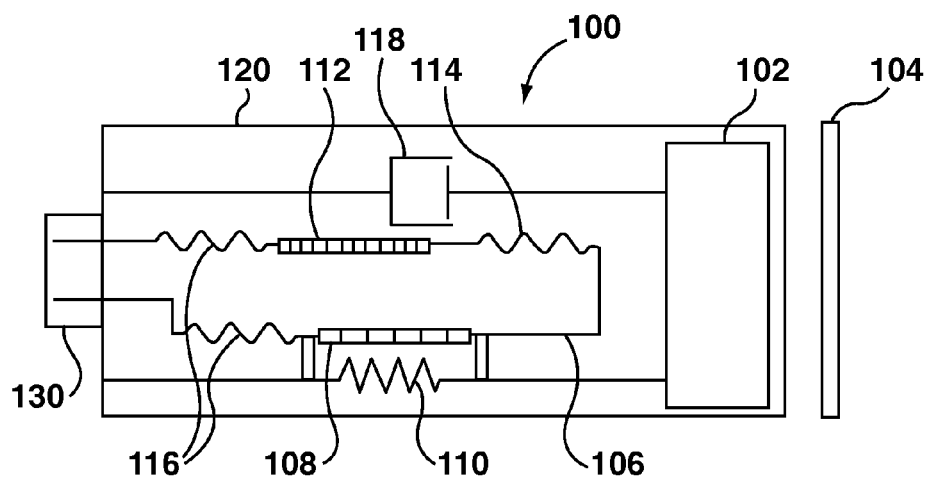
FIGS. 1A and 1B are schematic diagrams of an embodiment of a proximity sensor showing the mass in the sensor in a near and far position relative to a target.

A proximity sensor is described that allows for non-contact determination of the position of a target in proximity to the proximity sensor. The determination may be made using a single optical fibre within the sensor. The optical fibre can also be terminated with a connector at either end, permitting multiple sensors to be cascaded.

In one embodiment, a proximity sensor is provided for non-contact detection of a target. The proximity sensor includes a flexible sensor body that is configured to identify a change in strain applied to the body. The change may be identified by the sensor body providing a signal representative of the strain or a change in the strain applied to the body. Alternatively, an interrogation of the sensor body may provide a reading representative of the strain or change therein.

The proximity sensor also includes a mass that is connected to the flexible sensor body and configured to be operable to apply strain on the sensor body. The mass can be connected directly to the sensor body or can be connected to a flexible connector that is connected to the sensor body. The mass is also configured to be able to move relative to the target to apply strain to the sensor body. The movement of the mass relative to the target can take the form of an attraction or repulsion force. For example, the mass and target can be formed of magnetic and ferrous material, with no stipulation as to which component is formed of which material. Positioning of the target near the mass will therefore create a magnetic attraction between the two components and the position of the mass will change due to its attraction towards the target. As the mass moves towards the target a strain is placed on the sensor body, either directly or through the flexible connector if used, which translates to a change in the strain placed on the sensor body. This strain, or change in strain, can be identified by a separate interrogation component.

In an alternative embodiment, there is provided a fibre optic based, non-contact proximity sensor. The sensor may be used, for example, in aircraft applications. The sensor employs at least one fibre Bragg grating within the sensor body that is sensitive to the movements of a mass that is connected to the sensor body. The motion of the mass is constrained such that when the mass is a magnet that is attracted toward a ferrous target located near the magnet, the magnet's motion strains the sensor body and consequently the Bragg grating. When the ferrous target is located away from the sensor body the magnet is not attracted to the target and therefore the strain on the sensor body is different and the Bragg grating is in a relatively unstrained state. Various techniques, discussed further below, exist to interrogate a fibre Bragg grating to determine its strain level. This determination of strain level correlates to the target being near and/or far. In this embodiment, the sensor body may be an optical fibre having a fibre Bragg grating written into the fibre.

Fibre Bragg gratings are known in the art. A fibre Bragg grating is a periodic spatial variation in the refractive index of a fibre, achieved by 'writing' it with an ultraviolet laser and mask, or two interfering beams. The effect of the grating is to act as a wavelength selective mirror or a filter. Light travelling down the fibre is partially reflected by each index variation within the grating, but at most light wavelengths these reflections interfere destructively. At one narrow range of wavelengths, constructive interference occurs and light is reflected back toward the transmitter acting as a filter for this narrow range of wavelengths. This maximum reflectivity occurs at the Bragg wavelength $\lambda_B$ that is given by the expression $\lambda_B = 2n_{eff}\Lambda$ where $n_{eff}$ is the effective refractive index of the grating on the fibre and $\Lambda$ is the fibre Bragg grating period. The inverse of the Bragg wavelength is herein referred to as the Bragg frequency.

Strain on the fibre Bragg grating causes a change to the physical or mechanical properties of the fibre Bragg grating that results in a change in the Bragg wavelength. Thus, strain on the fibre increases or reduces the fibre Bragg grating period $\Lambda$ and the resulting Bragg wavelength. Temperature also has an impact on the fibre Bragg grating as expansion and contraction of the fibre Bragg grating will also change the period $\Lambda$ and thus the Bragg wavelength.

The fibre Bragg grating is a proven method to measure strain with an optic fibre, and its use extends beyond the laboratory into a variety of structural monitoring applications. As discussed further below, by combining two Bragg gratings into one sensor, one strained, and the other unstrained, compensation for temperature effects can be performed.

Other types of gratings, known in the art, may be used that are operable to register a change in strain applied to the sensor body upon which the grating is located. Examples of such gratings include, but are not limited to, long period fibre gratings and chiral gratings.

An alternative embodiment provides a sensor comprising an optic fibre having two Bragg gratings written in close proximity on the fibre. As stated above, Bragg gratings are sensitive to both strain and temperature. Connected to the fibre at a location adjacent one of the fibre Bragg gratings is a mass that is attracted to the detection target. The mass can be connected directly to the fibre or may be connected to the fibre using a spring or other flexible connector which will be discussed further below. The mass is attached to the fibre in a location adjacent one of the fibre Bragg gratings, referred to in this embodiment as the first fibre Bragg grating, so that any movement of the mass will translate to a strain on the fibre in the location of the first fibre Bragg grating. It is possible to calculate any change affected by strain alone on the first fibre Bragg grating by compensating for the effects of temperature that will be seen in the second fibre Bragg grating because both fibre Bragg gratings will be similarly affected by temperature changes. The second fibre Bragg grating will not be unduly affected by the strain from the movement of the mass due to its location away from the mass connection.

It will be understood that embodiments are not limited to the use of a magnet as the mass attached to the fibre in the sensor. For example, the sensor may include a mass formed from ferrous material that is connected to the fibre and the target may be a magnet. Alternatively, the mass may be formed from any type of material that is configured to move in relation to the proximity of a target which can be either attraction or repulsion. In other embodiments, both the target and the mass can be formed from magnetic material. It will be understood that in this embodiment the movement of the mass in relation to the target and the fibre acts in a similar fashion to the magnet embodiment described above to change the strain of the sensor body. The mass is preferably formed from light weight material. A light weight mass is preferable so that the sensor will less sensitive to external vibrations or accelerations and less damping can be used to stabilize the mass.

As stated above, the magnet can be directly attached to the fibre. In this embodiment the fibre can be formed from material that is operable to support the magnet and move and/or flex in response to the movement of the magnet and include sufficient elasticity to return to its original position, i.e. a relaxed position, when the magnet is not attracted to a target. In this embodiment the strength of the fibre can support the magnet.

In an alternative embodiment, the magnet may be connected to the fibre using a flexible connector, or a resilient connector, such as a spring. In this embodiment, the connector is attached to the fibre at one end and the magnet at the other. The connector is operable to move with the movement of the magnet relative to a target and particularly between an active position, in which the magnet is attracted to the target and stretches the connector, and a non-active position, in which no target is sensed and the magnet does not apply any strain, related to movement, on the connector.

Figure 1B:
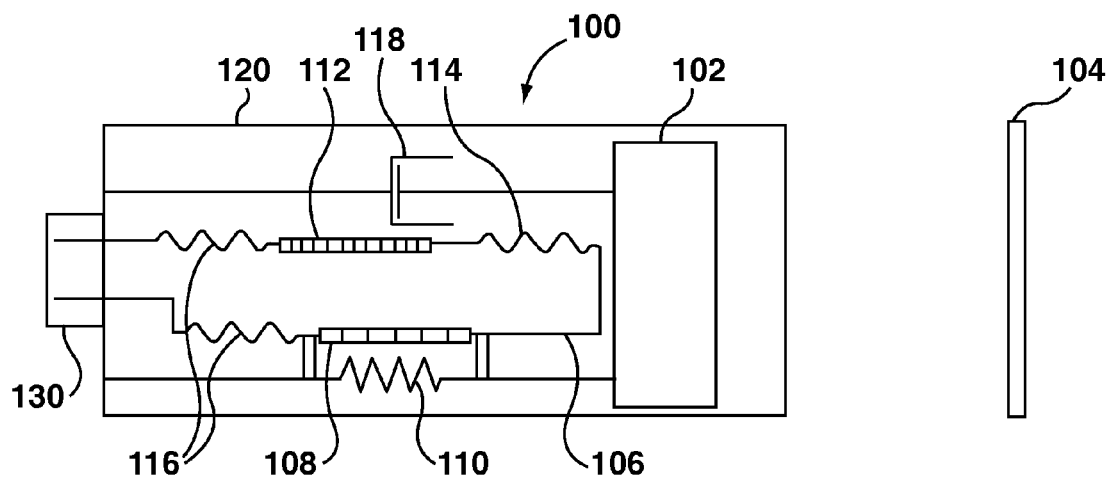

Reference is now made FIGS. 1A and 1B which shows a schematic diagrams of an embodiment of a proximity sensor 100 showing a mass 102 of proximity sensor 100 in near and far positions relative to a target 104. Mass 102 is coupled to an optic fibre 106 such that when mass 102 is attracted to target 104 strain is applied to optic fibre 106 in the active position shown in FIG. 1A. Mass 102 moves to the inactive position shown in FIG. 1B when target 104 is moved away from mass 102 so that they are outside the attractive field, such as a magnetic field when mass 102 is a magnet and target 104 is a ferrous material. Mass 102 and target 104 are attracted by an attraction force, typically a magnetic field generated by mass 102. Other embodiments can use a repulsive force between mass 102 and target 104 resulting in a reverse of the active and inactive positions.

Optic fibre 106 includes a strain sensor 108 that can be implemented as an optic fibre strain sensor within optic fibre 106, such as a fibre Bragg grating, or a similar variant. Strain sensor 108 has a characteristic frequency response that changes in response to strain applied to strain sensor 108. Strain sensor 108 can comprise a periodic variation in the refractive index of optic fibre 106 that results in the characteristic frequency response. If strain sensor 108 is implemented using fibre Bragg grating, for example, strain from mass 102 can affect the spacing of the Bragg gratings, and thus the Bragg grating period, that causes the frequency response of strain sensor 108 and optic fibre 106 to change. This can be seen as a shift in the Bragg wavelength/frequency between the active and inactive positions.

A flexible connector 110 can be used to couple mass 102 to optic fibre 106 to apply strain to strain sensor 108. Preferably, flexible connector 110 is coupled to strain sensor 108 of optic fibre 106. Optic fibre 106 can be fixably attached to the backside of flexible connector 110 in the area of a fibre Bragg grating. Flexible connector 110 allows mass 102 to move sufficiently to apply strain to strain sensor 108 and can also provide suspension of mass 102. Flexible connector 110 can be comprised of a suitable spring-like material. Proximity sensor 100 can also include a mass guidance apparatus to ensure that mass 102 moves linearly within housing 120 of proximity sensor 100. Flexible connector 110 can act as a spring to bias mass 102 into the inactive position. Flexible connector 110 can also provide some amount of damping of vibration/acceleration of mass 102.

One portion of strain sensor 108 can be attached to housing 120 and another portion coupled to mass 102, either directly or through flexible connector 110. Alternatively, one portion of strain sensor 108 can be attached to flexible connector 110 and housing 120 and another portion of strain sensor 108 can be attached to another portion of flexible connector 110 that is coupled to mass 102. Other embodiments can include other arrangements where the mass is supported by flexible connector 110 that allows movement of mass 102 to apply strain to strain sensor 108.

In some embodiments, optic fibre 106 can includes a temperature sensor 112 that can also be implemented as a fibre Bragg grating, or a similar variant, within optic fibre 106. Temperature sensor 112 allows proximity sensor 100 to be more sensitive to strain from mass 102 because the temperature effects of strain sensor 108 can be cancelled based on the measurements from temperature sensor 112. Temperature sensor 112 can be a second fibre Bragg grating that is located within optic fibre 106 that is not exposed to strain from movement of mass 102. Temperature sensor 112 can be attached to housing 120 to isolate temperature sensor 112 from mass 102 and strain applied to optic fibre 106.

Isolation of temperature sensor 112 allows any change in the second fibre Bragg grating to be attributed to temperature effects. A comparison can be made between strain sensor 108 and temperature sensor 112 to determine which changes are due to the effects of the strain from mass 102 alone. Preferably, temperature sensor 112 is located within housing 120 near strain sensor 108 so that they are subject to similar temperatures. In some embodiments, temperature sensor 112 can be located external proximity sensor 100. Other embodiments can have a single temperature sensor 112 that can be used to provide a temperature reading for multiple proximity sensors.

Each fibre Bragg grating can be positioned along optic fibre 106 having a sufficient length of fibre between adjacent fibre Bragg gratings that corresponds to the minimum spacing required for distinguishing the response from each grating. The minimum length of fibre between adjacent fibre Bragg gratings required will be known by a person skilled in the art. This spacing between fibre Bragg gratings provides a different impulse response for each fibre Bragg grating so that all sensors can be read in a time division multiplexing (TDM) manner. For example, in one embodiment optic fibre 106 can include several fibre Bragg gratings each separated by approximately 1 meter of fibre. The 1 meter of fibre located between adjacent fibre Bragg gratings may be coiled up so that the actual gratings may be placed physically adjacent to each other while maintaining sufficient spacing along the fibre for optimum reading. Placement of the gratings in this configuration allows for a comparison of adjacent gratings that may be affected by similar parameters, e.g. temperature, while adjusting for parameters that may not affect both gratings, e.g. strain applied by a moving mass or magnet.

Other embodiments could use fibre Bragg gratings with each having a distinguishable Bragg wavelength so that no minimum length of fibre would be required within proximity sensor 100. These gratings could be read in a frequency or wavelength division multiplexing (FDM or WDM) manner.

Proximity sensor 100 can include optical delay element 114 between strain sensor 108 and temperature sensor 112 along optic fibre 106. Optical delay element 114 can comprise a length of optic fibre 106 so that the response signal from strain sensor 108 and temperature sensor 112 can be distinguished. Optical delay element 114 can be a looped or coiled length of optic fibre to make efficient use of space within housing 120. An additional optical delay elements 116 can be provided between sensors 108, 112 and optical connector 130 so that if proximity sensor 100 is cascaded with another proximity sensor (i.e. optical connector 130 of two proximity sensors are connected by optical fibre) there will be a sufficient length of optic fibre between the sensors of the cascaded proximity sensors to distinguish the response from each proximity sensor.

Optical connector 130 can comprises two connections to optic fibre 106 that provides a loop over optic fibre 106 to connect the two connections. Looping the two connections of optical connector 130 allows multiple proximity sensors to be cascaded. Alternative embodiments of proximity sensor 100 can have an optical connector 130 with a single connection and optical fibre 106 terminates within proximity sensor. These embodiments can be preferable where only a single proximity sensor is required.

Proximity sensor 100 can further include a damper 118 to limit the effects that vibrations or acceleration of proximity sensor 100 can have on mass 102. Damper 118 can be coupled to mass 102 to limit the rate of movement of mass 102 due to vibration or acceleration of proximity sensor 100. Damper 118 can be hydraulic and can comprise a hydraulic cylinder and piston attached to mass 102. In the embodiment illustrated in FIG. 3B, housing 120 acts as the cylinder and mass 102 is coupled to a disc that acts as a piston. In other embodiments, damper 118 can be a viscous fluid (e.g. oil) that surrounds mass 102 to dampen movement of mass 102.

Figure 2A:
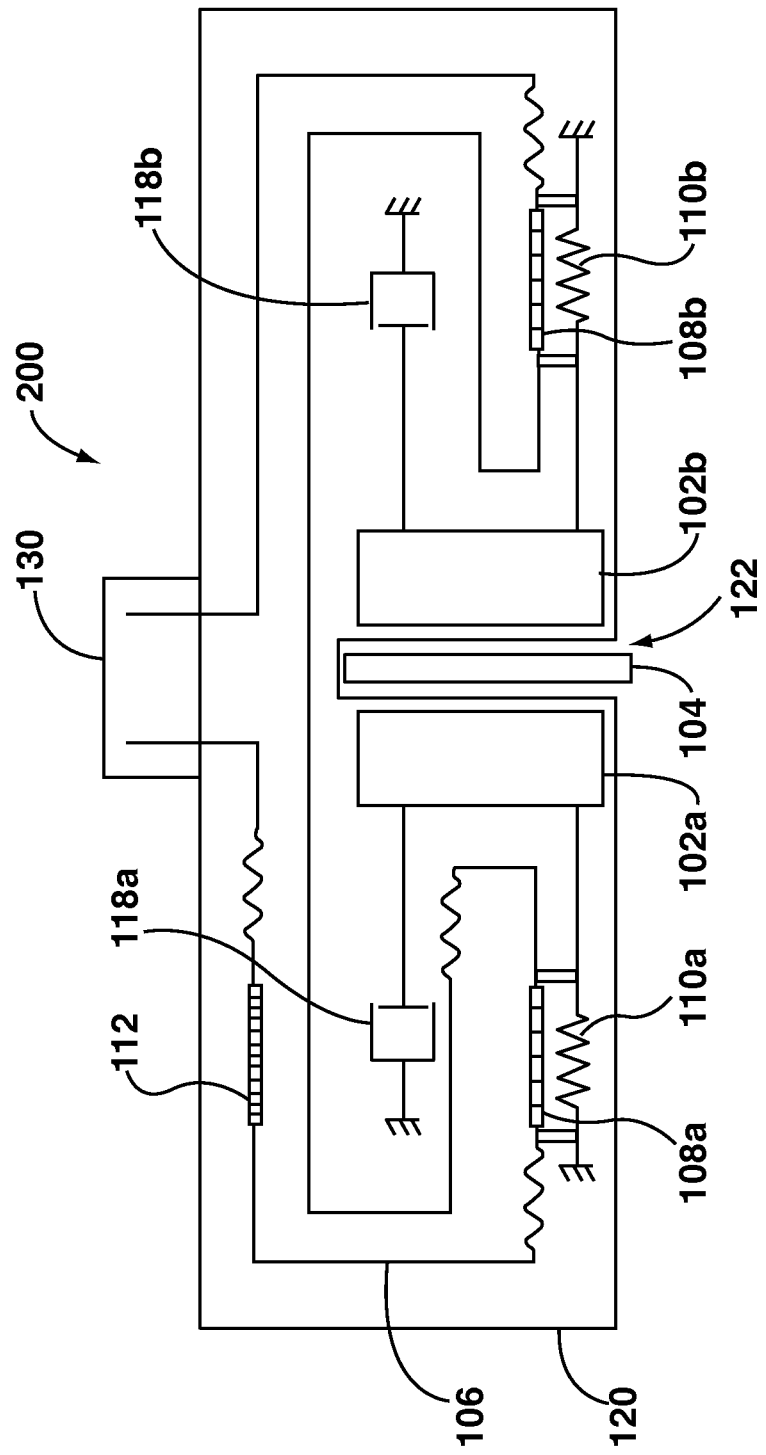
FIGS. 2A and 2B are schematic diagrams of an embodiment of a proximity sensor having opposing strain sensors showing the masses in a near and far position relative to a target.
Figure 2B:
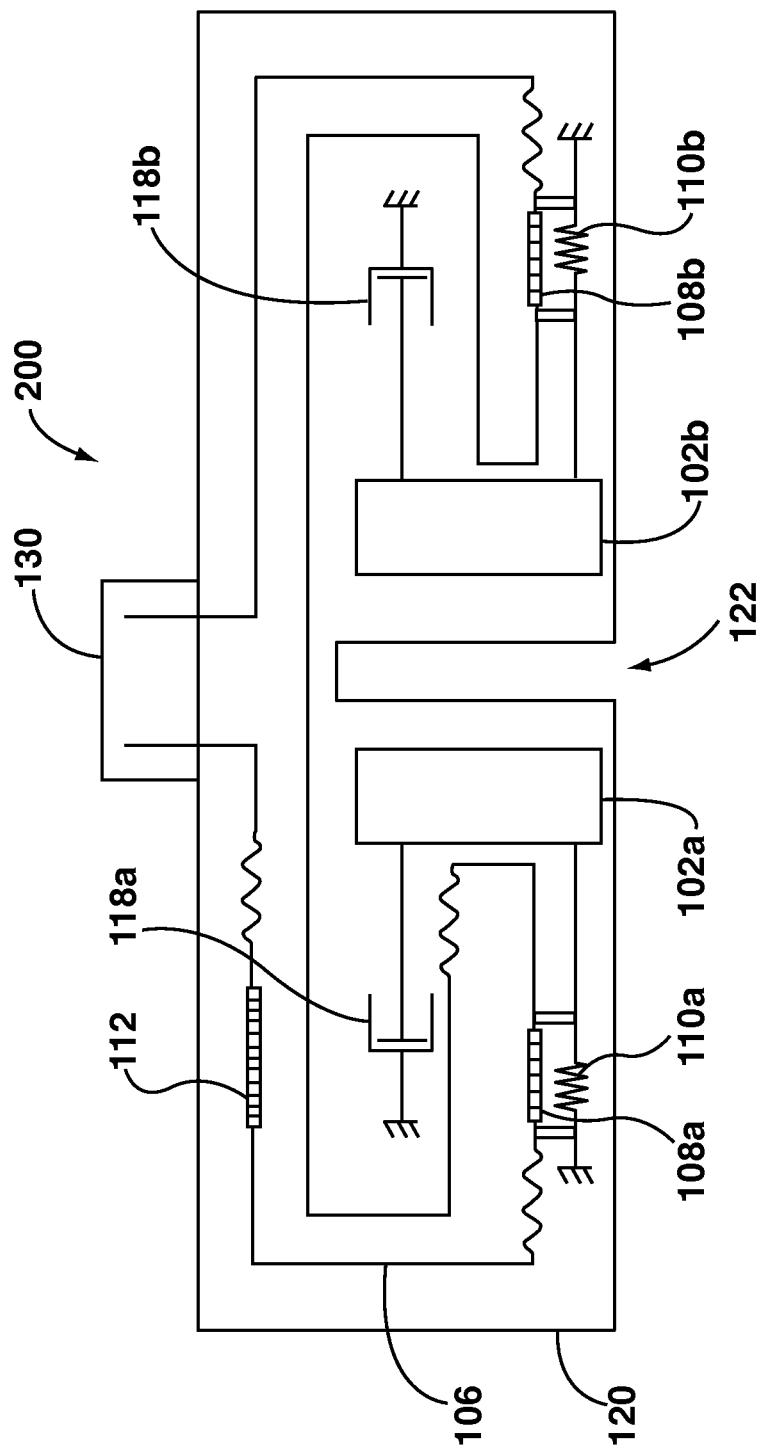

Referring now to FIGS. 2A and 2B, a schematic diagram of an embodiment of a proximity sensor 200 having opposing strain sensors 108a and 108b showing masses 102a and 102b in a near and far position relative to target 104. Similar elements to those of FIGS. 1A and 1B are labelled similarly with the subscript "a" and "b" to distinguish between the opposing elements. When target 104 is in the near position illustrated in FIG. 2A, masses 102a and 102b are attracted to target 104 and apply strain to strain sensors 108a and 108b. Using opposing strain sensors 108a and 108b can limit the effects of external vibrations and accelerations on proximity sensor 200. Housing 120 includes both strain sensors and defines a slot 122 for receiving target 104. Other embodiments using opposing strain sensors can be implemented with two separate housings (such as proximity sensor 100) arranged opposite one another and optically coupling the strain sensors.

Vibrations and acceleration will affect masses 102a and 102b similarly allowing these effects to be cancelled out from the differential response between strain sensors 108a and 108b. Optic fibre 106 provides a loop from optical connector 130 through both strain sensors 108a and 108b with sufficient a sufficient length of optic fibre to provide an optical delay to distinguish the response between both strain sensors 108a-b.

Figure 3A:
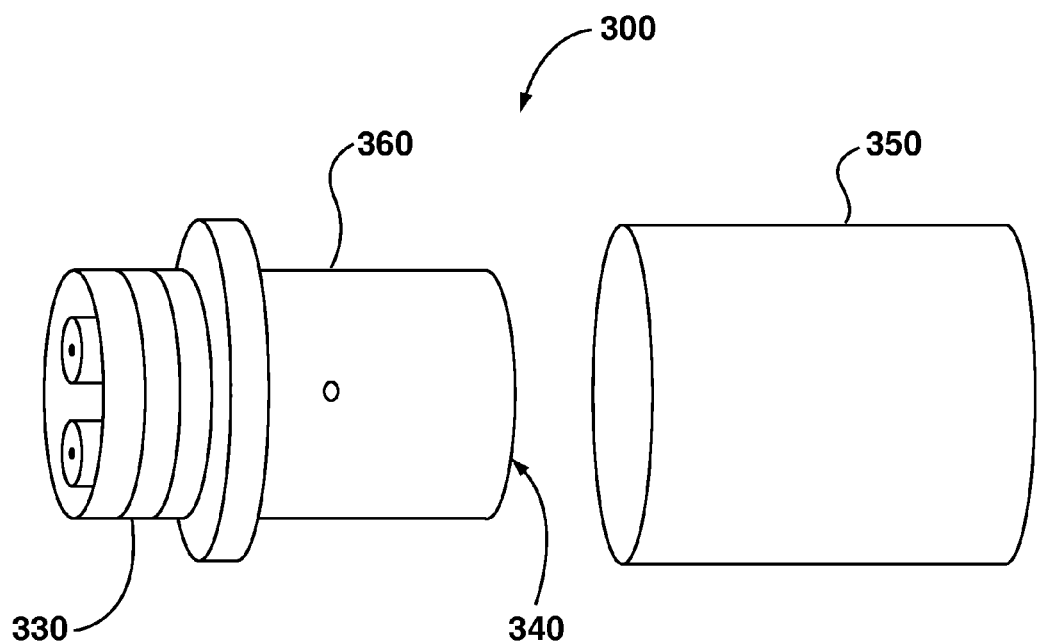
FIG. 3A is a perspective view of an embodiment of a proximity sensor housing prior to assembly showing the connector and sleeve on the left and the protective canister on the right.

Referring now to FIG. 3A, a perspective view of an embodiment of a proximity sensor housing 300 is shown. Sensor housing 300 is preferably constructed from non-magnetic materials such as, but not limited to plastic composites, aluminum, and non-magnetic stainless steel. Sensor housing 300 surrounds the optic fibre, the mass and the flexible connector (if included), and any mass guidance apparatus (if not integral with the flexible connector or sensor housing 300). Sensor housing 300 is preferably formed from a material that provides a hermetic seal of the interior components. The exterior of sensor housing 300 can be moulded or machined to incorporate threads to allow mounting and adjustment using non-magnetic nuts and washers. The threads allow the mounted position of sensor housing 300 to be adjusted to accommodate varying distances from the sensor to the target. An optical connector 330 can be moulded or machined into an end of sensor housing 300 that is suitable for the attachment of cabling and harnessing and allowing the appropriate connection and mating for optical fibre terminations. The end opposite optical connector 330 is the active end 340 that is exposed to the target which is terminated with a blunt face.

Sensor housing 300 is comprised of a sensor portion 360 that is coupled to the optical connector 330. Sensor portion 360 can include the optic fibre, sensors, and other elements illustrated in FIGS. 1A-B and 2A-B. A protective cover 350 can be placed over the sensor portion 360 and can be welded or bonded to the sensor portion 360 or optical connector 330. Sensor portion 360 and protective cover 350 can be cylindrical or any other shape that provides sufficient space for the internal components of proximity sensor 100.

Figure 3B:
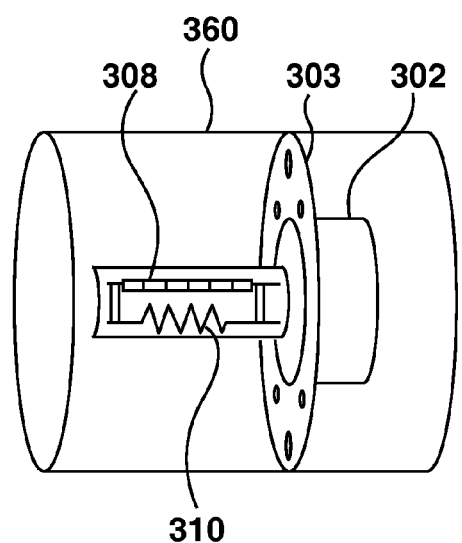
FIG. 3B is a perspective view of the embodiment of FIG. 3A showing an arrangement of the sensor components in the canister.

An embodiment of sensor portion 360 that provides damping is shown in FIG. 3B which illustrates a perspective view of the arrangement of the sensor components and damper within sensor portion 360. In this embodiment, mass 302 is coupled to a disc 303 that includes a plurality of holes located around its periphery. Alternatively, mass 302 can be shaped as disc 303 and include perforations.

Connected to mass 302 and disc 303 is either a strain sensor 308, such as an optic fibre upon which at least one fibre Bragg grating is located, or a flexible connector 308 which is also attached to an optic fibre upon which at least one fibre Bragg grating is located. Surrounding the components located within sensor portion 360 is a viscous fluid, preferably oil, that serves to dampen the movement of mass 302 and coupled disc 303. Damping can be controlled by the size and amount of perforations in disc 303. The oil will serve to dampen the movement of the magnet and fibre. Care must be taken to select oil with an appropriate viscosity range across the expected temperature range.

Figure 3C:
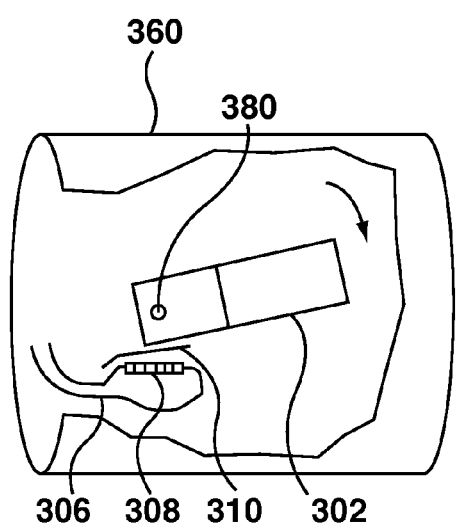
FIG. 3C is a perspective view of the embodiment of FIG. 3A showing an alternative arrangement of the sensor components in the canister.

Referring now to FIG. 3C, a perspective view of sensor portion 360 is shown illustrating an alternative arrangement of the components of proximity sensor 100. Sensor portion 360 can include a pin 380 about which mass 302 is operable to rotate. Sensor portion 360 serves to both support pin 380 and to constrain the outward motion of the rotation of mass 302. Attached to sensor portion 360 and cantilevered to support mass 302 is a flexible connector 310. Flexible connector 310 is manufactured from a suitable spring material providing suspension of mass 302 in an inactive position and sufficient flexure when deflected to be measured by strain sensor 308 of optic fibre 306. Optic fibre 306 can be fixably attached to the backside of flexible connector 310 in the area of strain sensor 308. The two ends of optic fibre 306 are terminated into connector 330.

In order to register a change in the strain placed on optic fibre 306 it is not necessary for mass 302 to actually physically move a significant amount. In one embodiment, mass 302 can be a magnet that is attached to a fixed support of flexible material that includes at least one fibre Bragg grating to act as strain sensor 308. When a target is positioned near the magnet, the magnet will pull against the support towards the target but does not move a significant amount due to its attachment to the flexible support. However, the pulling force on the support will still translate to a strain applied to the support and consequently to the fibre Bragg grating.

Determination of the magnet and fibre and/or flexible connector characteristics is accomplished by employing a magnet with a magnetic field density sufficient to achieve attraction to the desired target at a desired range. It will be understood that the attractive force has to generate a sufficient moment to overcome the force provided by optic fibre and/or flexible connector. The optic fibre and/or flexible connector in turn needs to provide an appropriate force/deflection characteristic such that it strains a sufficient amount to allow a clearly readable level of strain change. This is a coupled problem.

Figure 4:
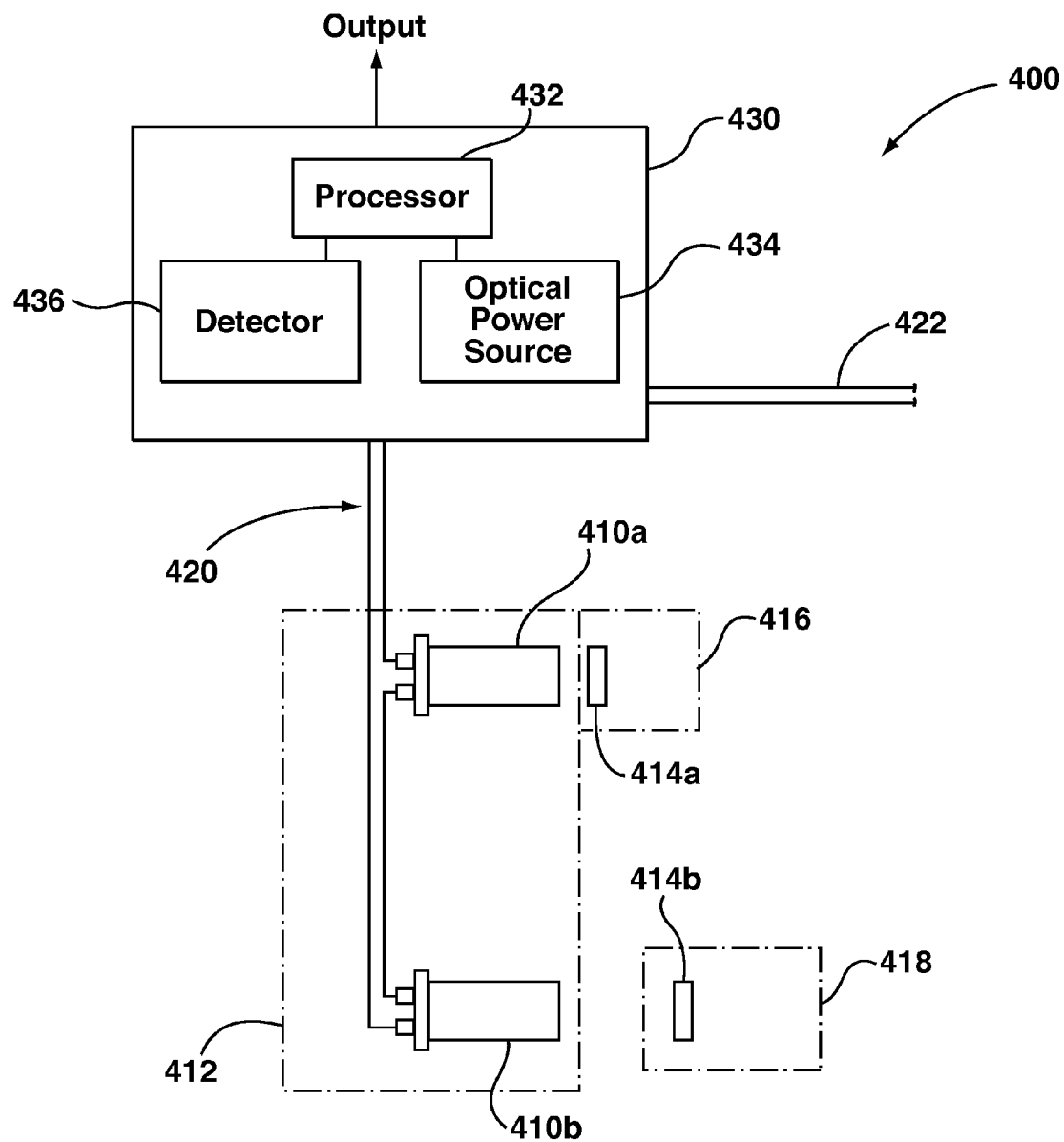
FIG. 4 is a block diagram of an aircraft fibre optic proximity sensor system having two proximity sensors connected by an optical fibre in a cascaded manner to a sensor interrogator.

Referring now to FIG. 4, shown is a block diagram of an aircraft fibre optic proximity sensor system 400 having two proximity sensors 410a-b connected by optical fibre 420 in a cascaded manner to sensor interrogator 430. Multiple proximity sensors 410a-b can be located throughout the aircraft to provide proximity sensing. Some example applications include landing gear position detection, landing gear bay doors, uplock sensing, door position sensing, high lift device position detection, thrust reverser position detection. Proximity sensors can also be embedded in composites that make up the aircraft structure. Proximity sensors 410a-b are illustrated in landing gear bay 412 for detecting target 414a in landing gear bay door 416 and target 414b located on landing gear 418. Optical fibre 420 can couple multiple proximity sensors that creates a loop between all the proximity sensors. Other embodiments can employ a non-returning/non-loop optical fibre 420 where the optical fibre 420 terminates in the final proximity sensor.

Aircraft fibre optic proximity sensor system 400 can also include redundant optical fibre 420 and proximity sensors 410a-b. In some embodiments, proximity sensor 100 itself can include redundant strain and temperature sensors, and in some embodiments, can further include separate optical connectors that are coupled to the redundant sensors. Other embodiments can also include a redundant sensor interrogator 430 coupled to the redundant optical fibre runs. Additional optical fibre runs 422 can be coupled to sensor interrogator 430 to provide sensing to different portions of the aircraft, such as, for example, a run for connecting the nose gear optical proximity sensors and a run for connecting the rear landing gear optical proximity sensors.

Sensor interrogator 430 is used to detect strain in the optical strain sensors of any coupled optical proximity sensors, such as proximity sensors 410a-b. Sensor interrogator comprises a processor 432 that is coupled to optical power source 434 and detector 436. Processor 432 controls the operation of optical power source 434 and detector 436. Interface to additional aircraft avionics systems to provide output of proximity sensing can also be controlled by processor 432. Sensor interrogator 430 can be located in the aircraft avionics bay and coupled to known avionics buses to provide the state of proximity sensors, warnings and errors to other aircraft avionics systems, including indicators in the cockpit.

Optical power source 434 is coupled to optical fibre 420 and is preferably a broad spectrum light source that operates over the range of the optical sensors. For example, optical power source 434 can include one or more semiconductor lasers that provide optical power over the range of Bragg frequencies of all fibre Bragg grating strain sensors. Optical power source 434 could also include a tunable laser. In some embodiments, optical power source 434 can include a pulse generator for generating a time limited optical signal.

Detector 436 is coupled to optical fibre 420 and can use any number of a variety of techniques to interrogate optical fibre sensors, such as strain or temperature sensors implemented using fibre Bragg gratings or similar variants. Detector 436 can determine the shift or variation of the Bragg frequency of each optical fibre sensor. Detector 436 typically comprises a photodetector and an apparatus to allow for frequency analysis, such as, for example, an interferometer, polychromator or optical filter device.

In some embodiments, each optical fibre sensor can have a distinct Bragg frequency, for example, the strain sensors of proximity sensors 410a-b can have distinguishable Bragg frequency, so that each sensor can be interrogated simultaneously to detect any shift in the Bragg frequency. This can be referred to as wavelength (or frequency) division multiplexing (WDM or FDM) sensor interrogation technique. In other embodiments, each optical fibre sensor can share the same Bragg frequency and each optical fibre sensor can be distinguished by its response time to a pulsed signal from optical power source 434. The response times can be distinguished by an optical delay, such as, for example, separating the optical fibre sensors by a sufficient length of optical fibre 420. This can be referred to as time division multiplexing (TDM) sensor interrogation technique. Both TDM and WDM techniques can also be combined together.

Detector 436 can provide frequency shift information or the characteristic frequency information of each optic fibre sensors to processor 432 for determining proximity of targets 414a-b to proximity sensors 410a-b. Processor 432 can convert any frequency information to a corresponding strain or temperature measurement. The strain measurement can also be corrected to cancel out any temperature effects using the temperature measurement. The temperature correction can be obtained by subtracting the temperature sensor measurement from the strain sensor measurement in the frequency domain to simplify calculations. Processor 432 is configured to compare a strain measurement (e.g. frequency shift information or the characteristic frequency information of a optic fibre sensor) with a predefined threshold to determine whether the target is located in proximity to the proximity sensor. Alternatively, the strain measurement can be corrected using a non-fibre optic based temperature sensor located near either of proximity sensor 410a-b or a general ambient temperature sensor located elsewhere in the aircraft.

While this invention has been described with reference to illustrative embodiments and examples, the description is not intended to be construed in a limiting sense. Thus, various modification of the illustrative embodiments, as well as other embodiments of the invention, will be apparent to persons skilled in the art upon reference to this description. It is therefore contemplated that the appended claims will cover any such modifications or embodiments. Further, all of the claims are hereby incorporated by reference into the description of the preferred embodiments.

Any publications, patents and patent applications referred to herein are incorporated by reference in their entirety to the same extent as if each individual publication, patent or patent application was specifically and individually indicated to be incorporated by reference in its entirety.

What is claimed is:

1. A proximity sensor for detection of a target in a near position to the sensor, the sensor comprising:
   an optic fibre having an optic fibre strain sensor; and
   a mass flexibly coupled to the optic fibre, the mass configured to move in response to the near position of the target by magnetic attraction to the target or magnetic repulsion from the target, wherein movement of the mass alters strain applied to the optic fibre strain sensor.

2. The proximity sensor of claim 1, wherein the optic fibre strain sensor has a characteristic frequency response that shifts in response to the applied strain.

3. The proximity sensor of claim 2, wherein the optic fibre strain sensor comprises a periodic variation in the refractive index of the optic fibre.

4. The proximity sensor of claim 2, wherein the optic fibre strain sensor further comprises any one of a fibre Bragg gratings, long period fibre gratings and chiral gratings.

5. The proximity sensor of claim 2, wherein the optic fibre has an optic fibre temperature sensor that is isolated from movement of the mass, the optic fibre temperature sensor having a characteristic frequency response that shifts in response to temperature.

6. The proximity sensor of claim 5, wherein the optic fibre temperature sensor is located adjacent the optic fibre strain sensor.

7. The proximity sensor of claim 5, wherein the optic fibre has an optical delay between the optic fibre strain sensor and optic fibre temperature sensor, the optical delay comprising a length of the optic fibre to distinguish the characteristic frequency response of the optic fibre strain sensor from the characteristic frequency response of the optic fibre temperature sensor.

8. The proximity sensor of claim 1 wherein the mass is a magnet and moves in response to the target.

9. The proximity sensor of claim 1 further comprising a damper coupled to the mass.

10. The proximity sensor of claim 1 further comprising a resilient connector to couple the mass to the optic fibre.

11. The proximity sensor of claim 1, the optic fibre further comprising a second optic fibre strain sensor flexibly coupled to a second mass, the second mass configured to move in an opposite direction to the mass in response to the near position of the target.

12. The proximity sensor of claim 4 wherein the optic fibre strain sensor has a fibre Bragg grating and the mass is formed from magnetic material and coupled to the optic fibre at a portion adjacent the fibre Bragg grating.

13. The proximity sensor of claim 12, wherein the mass is operable to move between an active position and an inactive position, the active position being located distal to the optic fibre and the inactive position being located proximal the optic fibre.

14. The proximity sensor of claim 12, wherein the mass is coupled to the optic fibre using a spring flexure.

15. The proximity sensor of claim 12, wherein the mass is connected to one end of a spring that is connected at an opposing end to the optic fibre at a position adjacent the fibre Bragg grating.

16. The proximity sensor of claim 12 further comprising a housing containing the optic fibre.

17. The proximity sensor of claim 16 further comprising damping means within the housing.

18. A proximity sensor for detection of a target in a near position to the sensor, the sensor comprising:
   an optic fibre having an optic fibre strain sensor; and
   a mass flexibly coupled to the optic fibre, the mass being a magnet configured to move in response to the near position of the target, wherein movement of the mass alters strain applied to the optic fibre strain sensor.

* * * * *